United States Patent
Ruckerbauer et al.

(10) Patent No.: US 7,009,848 B2
(45) Date of Patent: Mar. 7, 2006

(54) METHOD, ADAPTER CARD AND CONFIGURATION FOR AN INSTALLATION OF MEMORY MODULES

(75) Inventors: Hermann Ruckerbauer, Moos (DE); Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 37 days.

(21) Appl. No.: 10/609,873

(22) Filed: Jun. 30, 2003

(65) Prior Publication Data

US 2004/0004822 A1    Jan. 8, 2004

(30) Foreign Application Priority Data

Jun. 28, 2002    (DE) .............................. 102 29 120

(51) Int. Cl.
*H01R 12/16*    (2006.01)
(52) U.S. Cl. .................. 361/785; 361/788; 361/684
(58) Field of Classification Search ............... 361/785, 361/788, 760, 736, 748, 775, 684
See application file for complete search history.

(56) References Cited

U.S. PATENT DOCUMENTS

| 5,530,623 | A | 6/1996 | Sanwo et al. |
| 6,142,830 | A | 11/2000 | Loeffler |
| 6,363,450 | B1 * | 3/2002 | Lash et al. ................. 710/301 |
| 6,542,373 | B1 * | 4/2003 | Oba ........................ 361/760 |

FOREIGN PATENT DOCUMENTS

| EP | 0 940 850 A1 | 9/1999 |
| EP | 1 065 752 A1 | 1/2001 |

* cited by examiner

*Primary Examiner*—Kamand Cuneo
*Assistant Examiner*—Hung S. Bui
(74) *Attorney, Agent, or Firm*—Laurence A. Greenberg; Werner H. Stemer; Ralph E. Locher

(57) ABSTRACT

Memory modules without signal-conditioning devices (unbuffered, unregistered) are provided in a system by using adapter cards that have signal-conditioning devices and are then operated in the manner of memory modules with signal-conditioning devices (buffered, registered). Systems can thereby be expanded in a very simple manner and can be flexibly adapted according to requirements, and for this purpose only one type (unbuffered, unregistered) of memory module is required.

10 Claims, 3 Drawing Sheets

METHOD, ADAPTER CARD AND CONFIGURATION FOR AN INSTALLATION OF MEMORY MODULES

BACKGROUND OF THE INVENTION

Field of the Invention

The invention relates to a method for configuring and operating an installation of memory modules that do not have signal-conditioning devices and that are configured on slots of a system. Initially a system motherboard that has the slots and a number of memory modules without signal-conditioning devices are provided.

In modular electronic systems with variable configurations, a system motherboard with one or a plurality of slots is normally provided. Depending on the requirements of the system or the configuration level of the system, the slots are in each case equipped with a memory module or are unequipped. The interfaces of the memory modules are by necessity identical or compatible with one another.

A typical example of a modular memory system of this type is a computer system (PC, workstation, server) with expandable base memory, whereby slots for memory modules in the form of plug-in sockets are provided on the system motherboard and, depending on the required size of the base memory, are equipped with memory modules. Furthermore, the plug-in sockets in each case establish an electrical connection between signal lines on the substrate and contact areas on the memory modules. The memory modules are normally provided in the form of SIMMs (single inline memory modules) or DIMMs (dual inline memory modules).

The plug-in sockets enable simple exchange or simple retrofitting of the memory modules.

The requirements for the design of the bus system signal lines increase with higher clock rates and data transmission rates to and from the memory modules.

A data transmission rate of 667 Mbit per second and per data signal (Mbit/s/pin) is proposed here for DDRII bus systems for DDR-DRAMs (double data rate dynamic random access memories), and a data transmission rate of 1.2 Gbit/s/pin is proposed for DDRIII bus systems. With these data transmission rates, substantial outlay is required to ensure signal integrity at a respective receive location of data signals transmitted on the bus system signal lines, since a parasitic capacitance allocated to the signal line is too high to be able to be recharged quickly enough by a bus-monitoring chip or by memory chips arranged on the memory modules. Furthermore, signal integrity is adversely affected by reflections at interference points as the clock rate increases.

It is therefore proposed to insert buffer chips for signal conditioning between the memory chips and the bus system signal lines, similar to those already known from DDRI bus systems for control and address signals.

In DDRI bus systems, for configurations with two and more memory modules, the memory modules are provided with signal-conditioning devices such as buffer chips and/or buffer memories (registered DIMMs). Since the bus system signal lines are then no longer connected to all memory chips arranged on the memory modules, but to one memory chip only, the capacitive load of the signal lines represented by the memory module and the number of interference points are reduced. The disadvantage of this solution is the need for a delay cycle (latency) between the transmission of control and address signals on the control and address lines on the one hand and the transmission of data on data lines on the other hand. In a write cycle, the control and address signals are initially transmitted to a buffer or buffer memory and are only transmitted to the memory chips in a following cycle together with the data signals which are output following a one-cycle delay.

The delay cycle significantly reduces the data transmission rate, particularly in the case of random address accesses.

If signal-conditioning devices are implemented for DDRII and DDRIII bus systems, the signal-conditioning devices must be provided either on the memory modules or on the system motherboard.

Both solutions result in serious disadvantages.

A configuration of the signal-conditioning devices on the memory modules on the one hand increases the cost of the memory modules and, on the other hand, testing of the memory modules is rendered difficult. The reason for this is that, as the memory chips are no longer directly accessible via the memory module interface, the outlay required, for example, to test for adequate time conditions (time margins, skew) in the memory chips is considerably increased.

If, however, the signal-conditioning devices are provided on the system motherboard, the signal-conditioning devices are also functional for configurations in which they are not required, and reduce the functionality (performance) of the memory modules due to the then essentially superfluous delay cycles.

SUMMARY OF THE INVENTION

It is accordingly an object of the invention to provide a method for configuring and operating an installation of memory modules, such that a memory volume of a system, which is limited by a number of slots, is increased in a simple manner, such that a data transmission rate within the system can be adapted to the relevant memory volume, and such that the memory modules can be designed with little outlay. Another object of the invention is to provide an adapter card and a configuration with such adapter cards that will enable the objects stated above.

In the inventive method, memory modules are therefore arranged on an adapter card that has signal-conditioning devices. The adapter card is then installed in a system. Here, the memory modules that are arranged on the adapter card do not have signal-conditioning devices (unbuffered, unregistered, referred to below as unbuffered), but are then operated as buffered memories from the perspective of the system.

With the method, systems can therefore be adapted in a very simple and flexible manner according to requirements. The memory volume of a system can be increased in a simple manner by a multiple. Systems with a low memory volume can be operated at very fast data transmission rates through the installation of solely unbuffered memory modules.

On the other hand, through the use of the adapter card, the load on the bus system signal lines is reduced exclusively in systems for which a large memory volume is required, at the expense of the data transmission rate, without special measures on a system motherboard or a special type of memory module being required for that purpose.

The systems can be optimized in terms of memory volume and data transmission rate with a single type of unbuffered memory module.

In detail, therefore, in the method for an installation of memory modules on slots of a system, a system motherboard which has the slots, a number of memory modules without signal-conditioning devices, and at least one adapter card which in each case has at least one plug-in socket and a signal-conditioning device are initially provided. A subset of the memory modules is then arranged in the plug-in sockets of the adapter card and the adapter cards, equipped in each case with one or more memory modules, are provided on the slots of the system.

The unbuffered memory modules, which have no signal-conditioning devices, are then operated by the system in the manner of buffered memory modules i.e. memory modules with signal-conditioning devices.

The adapter cards are preferably equipped with the memory modules before the adapter cards, which are then provided in each case with one or more memory modules, are arranged on the slots.

Here, a combined equipment of the slots is also possible for system optimization, whereby a buffered or an unbuffered memory module is provided on at least one slot and an adapter card equipped with memory modules is provided on one of the remaining slots.

An adapter card for the installation of memory modules on slots of a system includes a substrate, at least one plug-in socket to, in each case, accommodate one of the memory modules, an interface compatible with one of the slots and, in addition, a signal-conditioning device to operate unbuffered memory modules arranged in the plug-in sockets without signal-conditioning devices in the manner of buffered memory modules with signal-conditioning devices.

If the adapter card has more than one plug-in socket, the memory volume of the system, which is restricted by the number of slots, can be simply increased to a multiple.

The adapter card preferably has an even number of plug-in sockets, as this then advantageously produces a symmetrical configuration of the memory modules with identical line lengths.

According to a first preferred embodiment of the adapter card, the plug-in sockets are arranged horizontally in pairs opposite one another on the substrate for this purpose. This advantageously produces a configuration of the memory modules which lies parallel to the substrate or a substrate surface and is therefore space-saving. Very short gaps between the slots are then possible.

If the horizontally-mounted plug-in sockets are provided in an area removed from the interface on the substrate and are oriented towards the interface, the signal-conditioning device can be arranged in the immediate vicinity of the interface. This advantageously produces a short feeder line from the interface to the signal-conditioning device. A short feeder line has a favorable effect on the reflection behavior and on a change to a signal transmitted on the feeder line caused by a loss-affected signal line (transmission line).

In a second preferred embodiment, the plug-in sockets are arranged on the adapter card according to the invention on one of the two surfaces of the substrate and are vertically mounted. The memory modules provided in the plug-in connections are then arranged perpendicular to the surface of the substrate. This embodiment also produces an advantageous short feeder line from the interface to the signal-conditioning device.

Here, the signal-conditioning device preferably includes two DQ buffers for the signal conditioning of data signals and one CA buffer for the signal conditioning of control and address signals. Due to the two DQ buffers, signal lines for the transmission of data signals can follow a shorter route to the respective DQ buffer with fewer reflection points. The DQ buffers are preferably arranged in a line parallel to the interface, and the CA buffer is provided between the two DQ buffers.

Each signal-conditioning device has conventionally designed buffer and/or PLL (phase locked loop) devices.

However, the adapter card preferably has precisely two plug-in sockets, and an interface between the adapter card and the system motherboard that is compatible with the electrical interface of the memory modules. The additionally required addressing of the plurality of memory modules arranged on an adapter card can be implemented using the available interface.

In addition, for addressing the plurality of memory modules arranged on the adapter, it is also possible to provide the adapter card interface with a higher number of pins compared with the interface of the memory modules, or in the case of an equal number of pins, with a different pin assignment.

The adapter card preferably also has an interface which is mechanically compatible with corresponding interfaces of the memory modules. The adapter card is then fully compatible with the memory modules and can be arranged in the system, even in combined configurations, with individual memory modules without modifying the system motherboard. There is no need to adapt the systems to the adapter cards.

In the second preferred embodiment of the adapter card with vertically mounted plug-in sockets on one of the two surfaces of the substrate, an adequate gap, corresponding roughly to the installation height of the memory modules, must be provided between the slots of the system motherboard. If the adapter card is then provided in two types with plug-in sockets arranged as a mirror image of one another, two adapter cards of different types can be arranged very close to each other, thus advantageously producing very short connection lengths between the slots, and therefore very small transit time differences of signals transmitted on corresponding signal lines.

Other features which are considered as characteristic for the invention are set forth in the appended claims.

Although the invention is illustrated and described herein as embodied in a method, adapter card and configuration for the installation of memory modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
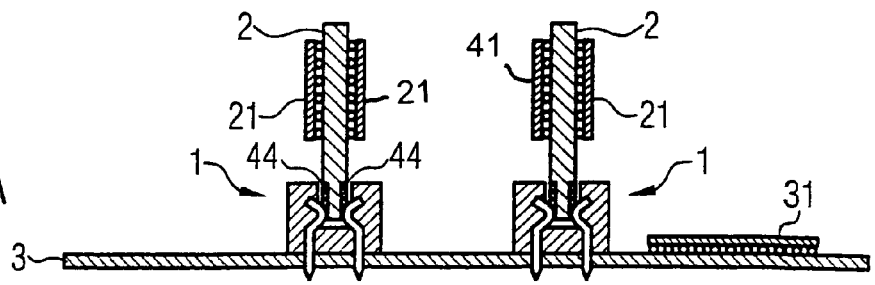
FIGS. 1A–1C are schematic cross-sectional views taken through configurations having a first exemplary embodiment of an adapter card.
Figure 1B:
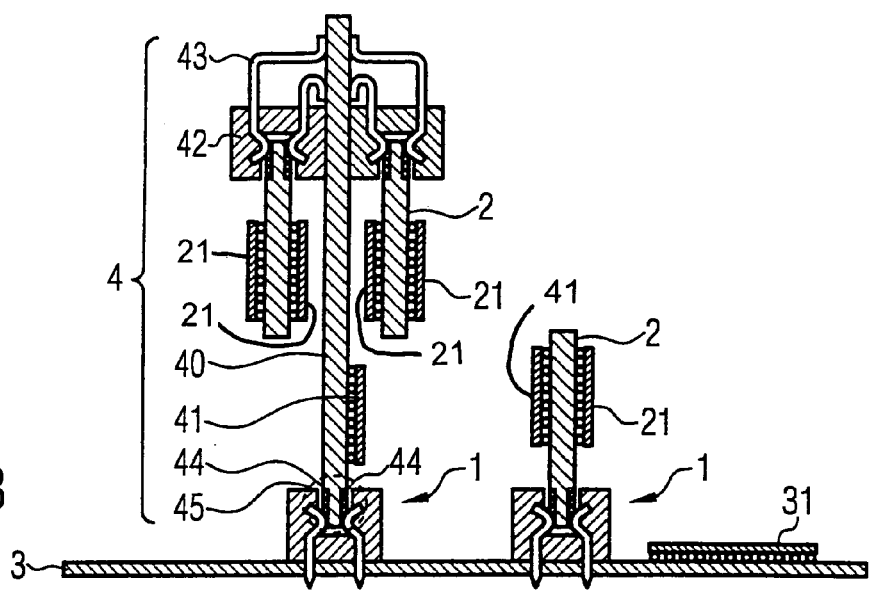
Figure 1C:
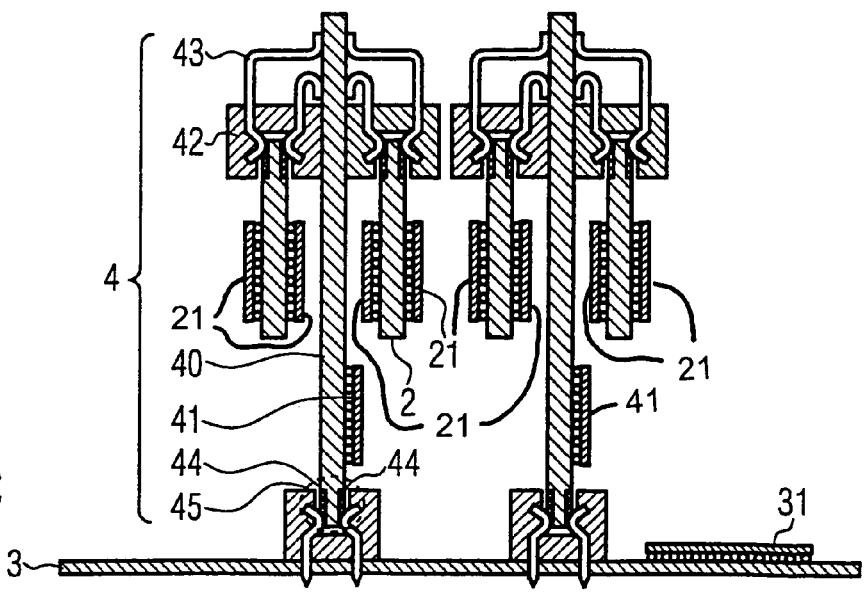

Referring now to the figures of the drawing in detail and first, particularly, to FIGS. 1A–1C thereof, there is in each case shown a cross-sectional view taken through a configuration with a system motherboard 3, a bus-monitoring chip 31 arranged on the system motherboard 3, and two slots 1 in each case shown as a plug-in socket.

In FIG. 1a, both slots 1 are equipped with memory modules 2 having memory chips 21.

In FIG. 1c, on the other hand, adapter cards 4 are arranged on the two slots 1. Here, each adapter card 4 includes a substrate 40, an interface 45 that has contact elements 44 to the slot 1, a signal-conditioning device 41, two plug-in sockets 42, and also contact devices 43, via which the memory modules 2 arranged in the plug-in sockets 42 are electrically connected to lines provided on or in the substrate 40.

The plug-in sockets 42 are arranged opposite one another on the substrate 40 and are mounted horizontally for a configuration of the memory modules 2 which is horizontal to the substrate 40. This produces the indicated, space-saving configuration of the memory modules 2 in the plug-in sockets 42 of the adapter cards 4.

FIG. 1b shows a configuration in which a left slot 1 is equipped with an adapter card 4, and a right slot is equipped with a memory module 2.

Figure 2A:
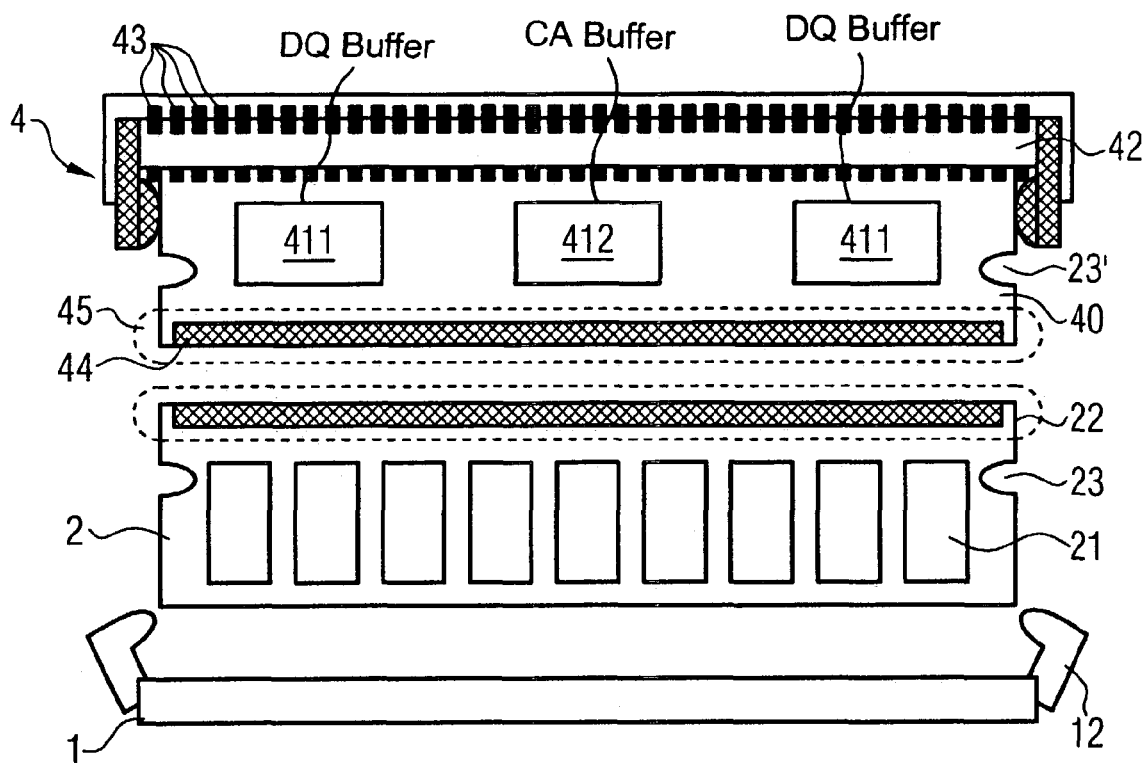
FIGS. 2A and 2B are side views of the configuration having the first exemplary embodiment of an adapter card.

FIG. 2a shows a slot 1, a memory module 2, and an adapter card 4. The memory module 2 has memory chips 21, a module interface 22 and indentations 23. An interface 45 which has contact elements 44 is formed along one edge of a substrate 40 of the adapter card 4. Two DQ buffers 411 and one CA buffer 412 are arranged in a line parallel to a plug-in socket 42. Contact devices 43 are arranged between the plug-in socket 42 and the substrate 40. The memory module 2 may be arranged in the plug-in socket 42. In this example, the module interface 22 and the interface 45 of the adapter card 2 are electrically compatible.

Furthermore, the illustration shows that the adapter card 4 has indentations 23', which are formed in the same way as the indentations 23 of the memory module 2 as counterparts to fixing devices 12 of the slot 1. Mechanical compatibility between the adapter card 4 and the memory module 2 is thereby also achieved.

Figure 2B:
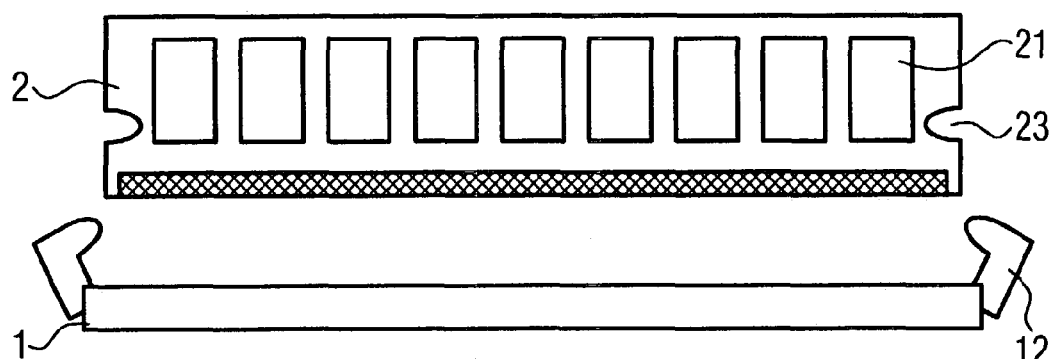

This compatibility becomes clear through comparison with FIG. 2b, in which a memory module 2 with indentations 23 is shown on a slot 1 with fixing devices 12.

Figure 3A:
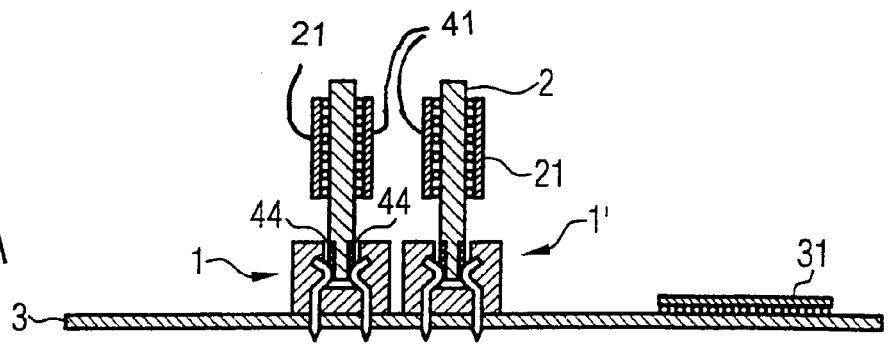
FIGS. 3A–3C are schematic cross-sectional views taken through configurations having a second exemplary embodiment of an adapter card.
Figure 3B:
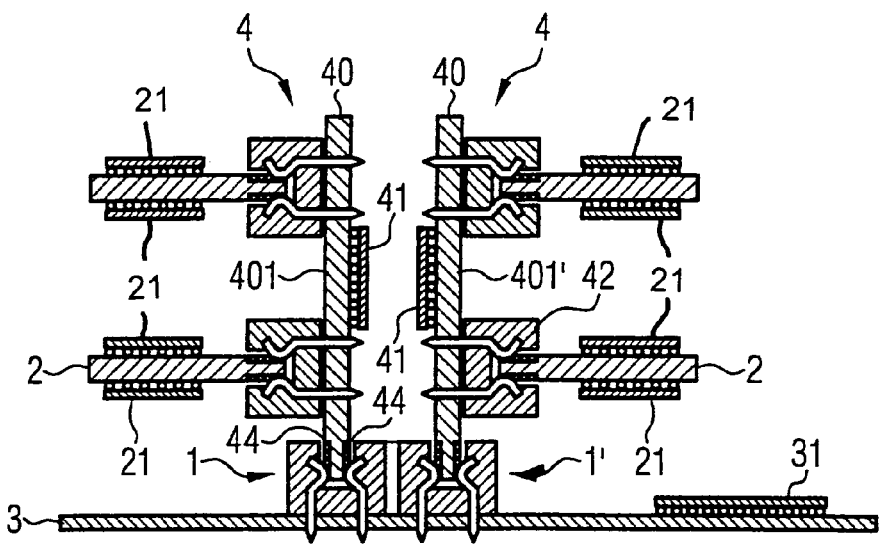
Figure 3C:
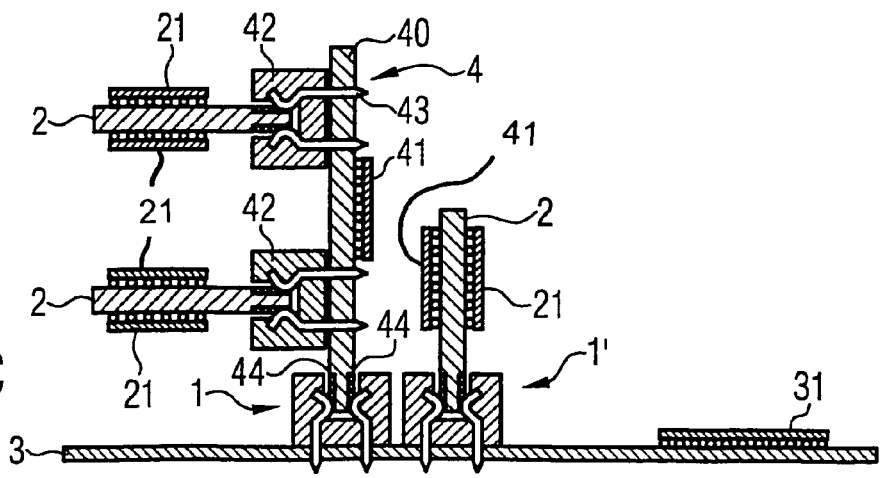

FIGS. 3a to 3c show cross-sectional views taken through a configuration with a system motherboard 3, a bus-monitoring chip 31 arranged on the system motherboard 3 and two slots 1 represented as plug-in sockets.

Here, FIG. 3a differs from FIG. 1a, which has already been described, in terms of the shorter gap between the two slots 1, 1'.

The reason for this, as shown in FIG. 3b, is that the adapter cards 4 differ from the adapter cards described in FIG. 1 in terms of vertical mounting of plug-in sockets 42 arranged on a surface of the substrate. 40. The vertically mounted plug-in sockets 42 enable a configuration of the memory modules 2 perpendicular to a substrate surface 401, 401'. Furthermore, a signal-conditioning device 41 is arranged on the surface opposite the plug-in sockets 42.

If either two mirror-image types of adapter cards 4 are then provided, or if the right slot 1' is arranged rotated through 180° in relation to the left slot 1, this in each case produces the configuration shown with, in a particularly advantageous manner, very short connections between the two slots 1, 1'.

FIG. 3c, corresponding to FIG. 1c, shows a combined connection configuration, in which an adapter card 4 is arranged in the left slot 1 and a memory module 2 is arranged in the right slot.

We claim:

1. A method for operating a plurality of memory modules, which do not have signal-conditioning devices, and at least one memory module, which has a signal-conditioning device, on slots of a system, the method which comprises:

providing a system motherboard having the slots of the system;

providing at least one adapter card having plug-in sockets and a signal-conditioning device;

configuring the plurality of the memory modules, which do not have signal-conditioning devices, in the plug-in sockets of the adapter card;

providing the adapter card on one of the slots of the system;

providing a memory module, which has a signal-conditioning device, on another of the slots of the system; and operating the plurality of the memory modules, which do not have signal-conditioning devices, in the system as memory modules having signal-conditioning devices.

2. An adapter card for operating at least one memory module, which does not have a signal conditioning device, on a slot of a system, comprising:

a substrate;

at least one plug-in socket for accommodating said memory module that does not have a signal conditioning device;

an interface compatible with the slot; and a signal-conditioning device for operating said memory module, which does not have a signal conditioning device, in said plug-in socket as a memory module having a signal-conditioning device, said signal-conditioning device including a DQ buffer for the signal-conditioning of data signals and a CA buffer for the signal-conditioning of control and address signals.

3. The adapter card according to claim 2, further comprising an even number of plug-in sockets; said at least one plug-in socket being one of said even number of plug-in sockets.

4. The adapter card according to claim 3, further comprising:

a plurality of memory modules;

said even number of plug-in sockets configured horizontally in pairs opposite one another on said substrate;

said substrate having a substrate surface;

said plurality of memory modules configured parallel to said substrate surface.

5. The adapter card according to claim 4, further comprising:

a plurality of plug-in sockets located on said substrate remote from said interface;

said plurality of memory modules configured in said plurality of plug-in sockets and being oriented towards said interface.

6. The adapter card according to claim 2, further comprising:

a plurality of plug-in sockets;

said substrate having a surface;

said plurality of plug-in sockets configured vertically on said surface of said substrate; and said plurality of memory modules configured in said plurality of plug-in sockets and being configured perpendicular to said surface of said substrate.

7. The adapter card according to claim 2, wherein:
said DQ buffer is one of two DQ buffers;
said two DQ buffers are configured in a line parallel to said interface; and
said CA buffer is configured between said two DQ buffers.

8. The adapter card according to claim 2, wherein said signal-conditioning device includes a buffer device and/or a PLL device.

9. The adapter card according to claim 2, further comprising exactly two plug-in sockets; said at least one plug-in socket being one of said two plug-in sockets.

10. The adapter card according to claim 2, wherein said interface is mechanically compatible with corresponding interfaces of the memory modules.

\* \* \* \* \*